Dec. 17, 1968 B. G. KERAMIDAS ETAL 3,416,956
PROCESS FOR FORMING A BARRIER IN A CADMIUM SULFIDE SOLAR CELL
Filed May 16, 1966
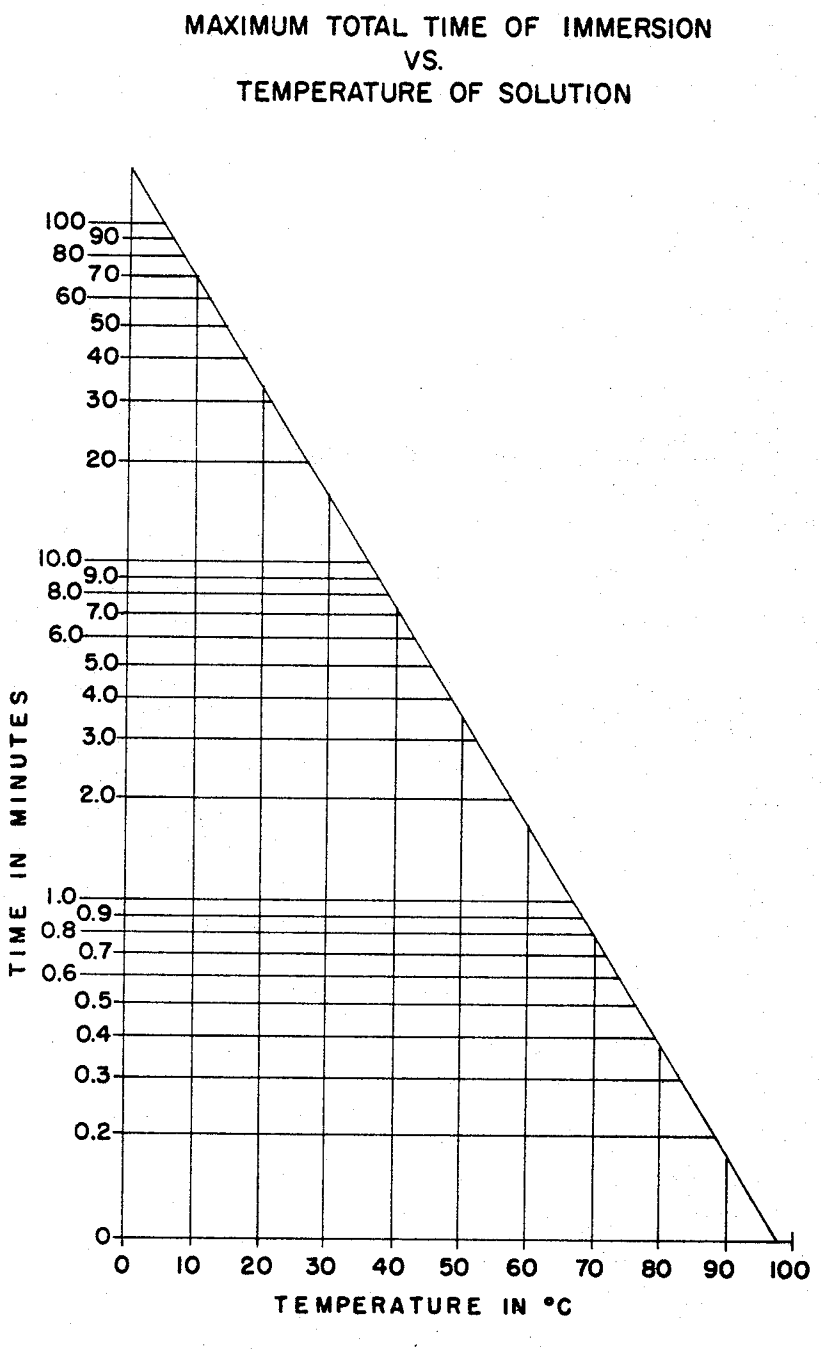
INVENTORS
JAMES C. SCHAEFER
BASILIO G. KERAMIDAS
BY Walter J. Monacelli
ATTORNEY United States Patent Office 3,416,956
Patented Dec. 17, 1968

3,416,956

PROCESS FOR FORMING A BARRIER IN A CADMIUM SULFIDE SOLAR CELL

Basilio G. Keramidas, Cleveland, and James C. Schaefer, North Royalton, Ohio, assignors to Kewanee Oil Company, Bryn Mawr, Pa., a corporation of Delaware Filed May 16, 1966, Ser. No. 550,196
14 Claims. (Cl. 117—200)

ABSTRACT OF THE DISCLOSURE

This invention comprises a process for forming the barrier layer in a CdS solar cell by depositing a copper sulfide barrier layer on the CdS of the voltaic cell by immersing the CdS into a solution of a cuprous compound, preferably cuprous chloride, at a temperature of 25–97° C., the solution concentration of cuprous compound being 5–20 percent by weight and the total period of immersion being not more than the maximum value indicated by a chart having time in minutes plotted against temperatures in ° C.

This invention relates to a process for forming the barrier in a CdS solar cell. More specifically it relates to a process for depositing a copper sulfide barrier layer on the CdS of a photovoltaic cell. Still more specifically it relates to the process of preparing a barrier layer on the CdS by direct chemical deposition of copper sulfide.

Cadmium sulfied photovoltaic cells with which the present invention is concerned are devices in which a barrier layer and photoactive centers are formed at a surface of an n-type crystalline cadmium sulfide. The cadmium sulfide cell can be of the polycrystalline thin film or single crystal type. Examples of such cells are described in Power Systems for Space Flight, Academic Press, volume II (1963), edited by M. A. Zipkin and R. N. Edwards.

Cadmium sulfide polycrystalline photovoltaic cells are also described in Carlson's U.S. Patent No. 2,820,841 which discloses a preferred type of photovoltaic cell as being one wherein the cadmium sulfide is in the form of a thin layer 0.2–10 microns thick. Advantageously this thin film of CdS is laid on a sheet of Mo, Ti, W, Ta or an Fe-Ni alloy available commercially under the trademark "Invar."

The function and utility of a "barrier" or "barrier layer" of photovoltaic cell is well known. In cadmium sulfide cells, the barrier layer is advantageously copper sulfide. It has been established that the desirable barrier component is a copper sulfide having the formula $Cu_xS_y$ wherein the ratio of $x/y$ is greater than 1 and less than 2. This range of values indicates that the copper ions are primarily in the cuprous state.

In a copending application, Ser. No. 376,168 filed by Basilio G. Keramidas on June 18, 1964, now Patent No. 3,374,108, it has been shown that a copper sulfide barrier layer can be deposited directly from an aqueous solution of a cuprous compound. Since cuprous salts are practically insoluble in water, the "solution" used as the source of cuprous ions is actually one in which the main body of the cuprous salt is at the bottom of the container and is being dissolved gradually as the cuprous ion in the very dilute solution is reacted to form the desired copper sulfide precipitate on the cadmium sulfide thin film.

Cuprous chloride is indicated as the preferred cuprous salt since it is the most soluble, having a solubility of about 0.15 gram per liter in water at 25° C. Although the cuprous chloride is not soluble in the amount ultimately deposited, it is gradually dissolved from the salt maintained in contact with the agitated solution as the cuprous ion is reacted and removed from the solution.

The figure is a curve showing maximum time versus temperature for which cadmium sulfide can be immersed in cuprous ion solutions with excessive or undesirable amount of cuprous ion migrating or diffusing into the CdS.

Cuprous chloride tends to decompose into cuprous oxide, copper and cupric chloride when dissolved in water, especially when the temperature is near the boiling point of the solution. As indicated in the aforementioned copending application, this decomposition can be avoided by using oxygen-free water, such as obtained by bubbling an inert gas, i.e. dry nitrogen, through the solution and maintaining an atmosphere of inert gas above the solution. This eliminates dissolved oxygen from the solution and enables the copper ions to remain in the cuprous state.

The copper sulfide barrier layer is formed by immersion of the CdS thin film into the solution of cuprous compounds under carefully controlled conditions, followed by rinsing and wiping, as described in the said copending application.

In accordance with the present invention, it has been found that the conversion efficiency of the photovoltaic cell can be increased considerably by using more highly concentrated solutions of cuprous compound, e.g. concentrations of 5–20 percent, preferably 5–10 percent by weight. These concentrations are considerably in excess of the solubilities of the cuprous compounds but it has been found that such higher concentrations can be obtained by forming soluble complexes of the cuprous compound.

While other materials can be used for this complexing purpose, the alkali metal halides are found to be particularly effective in increasing the solubility of the cuprous compounds. Particularly suited and economical for this purpose is sodium chloride. The particular material used in complexing and increasing the solubility of the cuprous compound is not critical so long as it is nonreactive with the other components of the system.

While the copper might be in the form of a complex ion and the cuprous ion itself ($Cu^+$) might be present in relatively small concentration in such systems, these systems seem to be more stable in providing the cuprous ion and give markedly improved results in conversion efficiencies of the resultant photovoltaic cells. Cells produced by the use of such complex solutions give efficiencies as high as 6.9 and an average efficiency of about 6.3. This is a remarkable improvement over the efficiencies obtained according to the procedure described in the aforementioned copending application wherein average efficiencies of about 4.2 are obtained. It is still further improved over cells in which the barrier layer is electroplated, which cells show an average efficiency of about 3.07.

While the purpose of this invention can be effected with about 5 grams per liter of cuprous chloride or equivalent amount of other cuprous compound, it is generally desirable in order to obtain optimum results to use about 60 grams per liter of cuprous chloride or the equivalent amount of other cuprous compound. With this concentration, the effect on conversion efficiency appears to have reached a plateau and while higher concentrations, for example 100 grams or more per liter of CuCl, can be used, they produce no greater efficiency than the 60 grams per liter concentration. Therefore a range of 5–20 percent concentration is appropriate but concentrations of 5–10 percent are preferred.

The amount of complexing agent to be used is dependent on the amount required to get the optimum concentration of cuprous compounds. Obviously, this will vary according to the particular complexing material and the desired concentration of the cuprous compound. The complexing agent can be first added to facilitate solution for the subsequent addition of the cuprous compound. It is generally sufficient to have approximately 200 grams of sodium chloride per liter of solution.

As indicated above, nitrogen or other insert gas is advantageously bubbled through the solution continuously, prior to and during the addition of the cuprous compound, and during the use of the solution in depositing the cuprous sulfide.

While a temperature range of about 25–97° C. can be used, or even higher where superatmospheric pressure is used, it is generally preferable to use a temperature of 70–90° C.

In effecting the copper sulfide deposition, the CdS is immersed for an appropriate period, generally about 50 seconds, in the cuprous compound solution. The immersion can be performed in one step, or the immersion time can be divided into two or three shorter periods with cold water rinsing and immediate drying after each immersion step.

Advantageously the immersion is done in three dipping operations of specific duration, the length of the immersion period being dependent upon the temperature of the solution. After each immersion, the cell is rinsed with cold distilled water, the rinsing being followed by a wiping with a soft absorbent material, such as a soft wiping cloth available on the market under the trademark "Kimwipe," preferably soaked in acetone. The immersion is advantageously performed in steps to avoid long exposure of the cadmium sulfide which is likely to cause diffusion of the copper ions into the CdS layer. By discontinuing the immersion periodically and rinsing with cold distilled water, the excessive diffusion of copper ions into the CdS is avoided or minimized.

As indicated above the migration or diffusion of cuprous ions into the CdS is a function of the temperature. This is shown in the figure which is a plotting of the maximum permissible immersion time versus temperature. Immersion for a period longer than indicated by this chart for any particular temperature is likely to produce an undesirable amount of cuprous ion migration into the CdS. This maximum time applies whether it is for a single immersion or a plurality of immersions. In the figure, the time in minutes is plotted in logarithmic scale on the ordinate and the temperature in ° C. is plotted in normal scale on the abscissa. The preferred immersion time is in the range of 1 to 15 minutes.

The basic process for the formation of the barrier layer is a displacement reaction which goes to completion due to insolubility of the resultant copper sulfides. Although the solubility constant of cadmium sulfide is $3.6\times10^{-29}$ at 18° C., the disassociation of CdS into $Cd^{++}$ and $S^{--}$ is responsible for the availability of sulfide ions which react with the cuprous ions in the solution to form the desired copper sulfide of the formula $Cu_xS_y$ as described above.

In this direct chemical deposition, temperatures are advantageously from room temperature to the boiling point of the solution (97° C.), preferably about 70–90° C. However, with increased temperature, the time of immersion must be shorter although the relationship is a non-linear function.

At the higher temperatures in this range, the formation of a barrier which will give photovoltaic cells of optimum performance depends critically on the time of immersion. This critically is gradually eliminated as the temperature is decreased. However, at lower temperatures, namely lower than 40° C., the resultant photovoltaic cells have lower short circuit current values than obtained by corresponding cells in which the barrier layer was deposited at higher temperatures. Apparently the lowest temperatures of the cited range have considerable effect in slowing down some of the desired chemical reactions.

It is advantageous to have the pH of the cuprous solution controlled in the range of 2–5.5, preferably about 2–4.5, to favor the formation of a barrier of optimum performance in the photovoltaic cells. The desired pH control can be achieved and retained by buffering the solution with various materials, such as tartaric acid and sodium hydroxide, etc.

The photovoltaic effect is evident after the immersion. However, to obtain the optimum short circuit current effect and to optimize the output, it is desirable to heat the cell after the immersion and the rinsing and wiping steps, in a vacuum or an inert atmosphere such as nitrogen, argon, helium, etc. for a period of 2 to 15 minutes at a temperature in the range of 100–300° C. advantageously at 150–250° C. Preferably the heat treatment is performed at about 250° C. for 2–10 minutes. Although dry air can be used at lower temperatures, it is generally preferred to use a dry inert gas such as nitrogen.

With photovoltaic cells prepared by this method, current densities up to 27 milliamps per sq. cm. and conversion efficiencies up to 6.9% can be achieved. The dry-atmosphere, high-temperature treatment improves the value of the open circuit voltage and the shape of the light I-V (current voltage) characteristic curve. While this treatment causes a slight drop in the value of the short circuit current, this drop is compensated for by the increase in the open circuit voltage. This dry-atmosphere, high-temperature treatment of cells produced by this invention gives photovoltaic cells of current density up to 27 milliamps per sq. cm. and conversion efficiencies up to 6.9%.

The invention is best illustrated by the following examples. These examples are intended merely for purpose of illustration and are not intended in any way to restrict the scope of the invention or the manner in which it may be practiced.

Examples I and II illustrate prior art processes for comparative purposes and subsequent examples illustrate the present invention. Unless specifically indicated otherwise, parts and percentages are given by weight.

EXAMPLE I

About 500 ml. of distilled water is placed in a one liter beaker equipped with tubes for dispersing gases therethrough. The water is heated to 65° C. and dry nitrogen bubbled through it for about 30 minutes. The dissolved oxygen is displaced thereby and an atmosphere of nitrogen is maintained above the water surface by continuing the nitrogen bubbling. Cuprous chloride (12.5 grams) is added to the heated water and solution faciiltated by the use of a magnetic stirrer. A CdS thin film, 6" x 6" deposited in a thickness of 0.002 inch on a Mo sheet 0.002 inch thick is used.

This polycrystalline CdS thin film is immersed in the cuprous chloride solution 30 seconds. Then it is removed, rinsed with cold distilled water and wiped off with a soft cloth ("Kimwipe") wet with acetone. The film is next reimmersed for another 20 seconds, again removed, rinsed and wiped off as before. A third immersion is effected for another 20 seconds, and the rinsing and wiping repeated. The CdS thin film has a barrier layer effective for use as a photovoltaic cell. This cell can often be used as it is, but is improved in performance by placing the cell in a dry air oven where the temperature is maintained at 150–200° C. for 10 minutes. This effects an improvement in the value of the open circuit voltage and a squareness of the light curve with no effect, or only a very slight effect in dropping of the short circuit current value.

EXAMPLE II

A 6" x 6" polycrystalline CdS thin film similar to that used in Example I is cut in two halves. One of the halves is electroplated and 9 samples cut from this. These are individually laminated by placing a film of nylon 0.5 mil thick over the CdS layer and over the nylon film is placed a polyimide film of 0.5 mil thickness. This polyimide film is radiation resistant and is available commercially under the trademark "Kapton." The films are spot welded to hold them in place by means of a small soldering iron. Then each unit is placed in a platen, evacuated and then a temperature of 230° C. and a pressure of 150 p.s.i. is applied to the top surface of the cell for approximately 5 minutes, after which it is cooled quickly. The nylon film serves as an intermediate adhesive layer to adhere the polyimide film to the CdS layer. These samples are each tested for open circuit voltage and short circuit current. The area is measured in each case, and the conversion efficiency and milliamps per sq. cm. calculated.

The values of the various tests and measurements of these 9 samples are given in Table I. The other of the two halves was cut into small size samples and six of these were immersed in accordance with the procedure in Example I to place a barrier layer thereon by direct chemical deposition from the cuprous chloride solution. These samples were then exposed to hot dry air for 15 minutes at a temperature of about 150° C. These samples were also laminated in accordance with the procedure used above. The values of various tests and measurements performed thereon are given below in Table II. As will be noted from these two tables, the conversion efficiencies are improved for those cells in which the barrier had been formed by direct chemical deposition as compared to those which had been electroplated. The average of the various efficiencies of cells made by direct chemical deposition method was 4.23% as compared to the average efficiency of 3.07% for the electroplated cells.

TABLE I.—ELECTROPLATED CELLS

| $V_{oc}$ (Volts) | $I_{sc}$ (ma.) | Area (cm.$^2$) | Efficiency (percent) | J (ma./cm.$^2$) |
|---|---|---|---|---|
| .43 | 58 | 4.08 | 3.66 | 14.2 |
| .42 | 53 | 4.20 | 2.89 | 12.6 |
| .42 | 54 | 4.00 | 3.08 | 13.5 |
| .41 | 63 | 4.25 | 3.70 | 14.8 |
| .42 | 67 | 4.75 | 3.20 | 14.1 |
| .40 | 57 | 4.60 | 1.87 | 12.4 |
| .43 | 54 | 4.20 | 2.98 | 12.9 |
| .44 | 47 | 4.00 | 2.98 | 11.7 |
| .42 | 63 | 4.76 | 3.26 | 13.2 |
| Average Efficiency | | | 3.07 | |

TABLE II.—CELLS ON WHICH THE BARRIER HAS BEEN FORMED BY DIRECT CHEMICAL DEPOSITION

| $V_{oc}$ (Volts) | $I_{sc}$ (ma.) | Area (cm.$^2$) | Efficiency (percent) | J (ma./cm.$^2$) |
|---|---|---|---|---|
| .44 | 48 | 3.50 | 3.91 | 13.7 |
| .45 | 42 | 3.85 | 3.36 | 10.9 |
| .44 | 51 | 3.20 | 4.43 | 15.9 |
| .43 | 57 | 3.35 | 5.05 | 17.0 |
| .46 | 47 | 3.30 | 4.26 | 14.3 |
| .44 | 57 | 3.40 | 4.35 | 16.7 |
| Average Efficiency | | | 4.23 | |

EXAMPLE III

The procedure of Example I is repeated except that the water to which the CuCl is added has previously had dissolved therein 200 grams per liter of NaCl, 60 grams per liter of CuCl is used and the solution is maintained at a temperature of 70° C. Cells produced according to this procedure are tested according to the procedure of Example II and are found to have conversion efficiencies of 6.9, 6.9, 6.7, 6.5, 6.3, 5.8 and 5.3 respectively, which show an average efficiency of slightly more than 6.3.

EXAMPLE IV

The procedure of Example III is repeated twice using cuprous bromide and cuprous iodide respectively in place of the cuprous chloride. In both cases improved results in values of the short circuit current and open circuit voltage are obtained as compared to prior art methods.

EXAMPLE V

The procedure of Example III is repeated a number of times with similar improved results using in place of the NaCl, 200 grams per liter respectively of $NH_4Cl$, KCl, LiCl, KBr, NaBr, NaI, and $NH_4Br$.

While the particular compound which gives the cuprous ion and the complexing compound can be of various types which give the desired solubility without producing any adverse effects in the solution such as oxidation, etc., it has been found satisfactory to use cuprous halides as the source of the cuprous ion and the alkali metal halides and ammonium halides as the complexing or solubilizing agent.

While certain features of this invention have been described in detail with respect to various embodiments thereof, it will, of course, be apparent that other modifications can be made within the spirit and scope of this invention and it is not intended to limit the invention to the exact details shown above except insofar as they are defined in the following claims.

The invention claimed is:

1. The process of preparing a barrier layer on cadmium sulfide adapted for use in a photovoltaic cell comprising the steps of (a) immersing said cadmium sulfide in an aqueous solution of a cuprous compound, said solution having a dissolved concentration of 5–20 percent by weight of said cuprous compound and having a temperature of about 25–97° C., the total period of immersion being not more than the value indicated by the following chart for the corresponding immersion temperature, said solution also contains a solubilizing component inert to said cadmium sulfide but adapted to improve the solubility of said cuprous compound;

(b) removing said cadmium sulfide from said solution;

(c) immediately thereafter rinsing said film with cold water; and (d) immediately thereafter removing the residue of rinse water from said film:

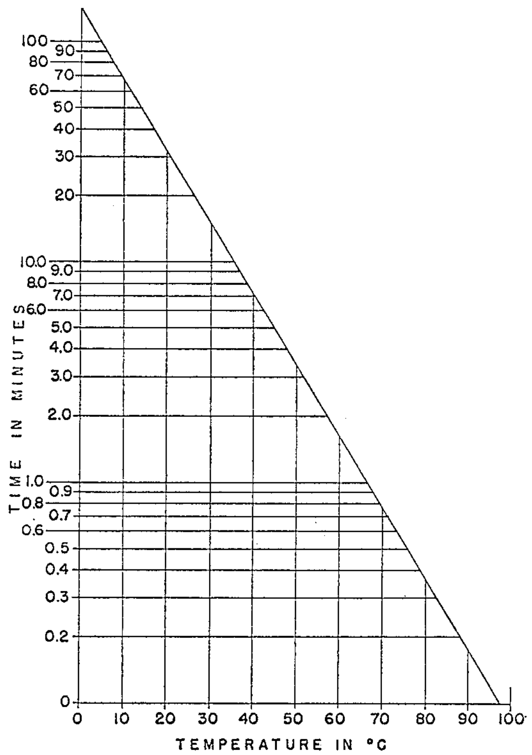

2. The process of claim 1 in which said cadmium sulfide is in the form of a polycrystalline thin film.

3. The process of claim 2 in which said immersion, rinsing and water removal steps are repeated at least once until a thickness of at least about 0.2 micron of copper sulfide is formed on said cadmium sulfide, the total immersion time being no more than indicated by said chart for the particular temperature used.

4. The process of claim 3 in which said cuprous compound is cuprous chloride.

5. The process of claim 1 in which said cuprous compound is cuprous chloride.

6. The process of claim 5 in which said temperature is about 70–90° C.

7. The process of claim 1 in which said solubilizing component is ammonium chloride in an amount sufficient to solubilize said cuprous compound to a concentration of at least 5 percent by weight.

8. The process of claim 1 in which said solubilizing component is potassium chloride in an amount sufficient to solubilize said cuprous compound to a concentration of at least 5 percent by weight.

9. The process of claim 1 in which said solubilizing component is lithium chloride in an amount sufficient to solubilize said cuprous compound to a concentration of at least 5 percent by weight.

10. The process of claim 1 in which said solubilizing component is sodium chloride in an amount sufficient to solubilize said cuprous compound to a concentration of at least 5 percent by weight.

11. The process of claim 10 in which said cuprous compound is cuprous chloride.

12. The process of claim 11 in which the resultant cuprous chloride-treated cadmium sulfide is maintained in an inert atmosphere at a temperature in the range of approximately 100–300° C. for 1–15 minutes.

13. The process of claim 11 in which the resultant cuprous chloride-treated cadmium sulfide is maintained in an inert atmosphere at a temperature in the range of approximately 150–250° C. for 1–15 minutes.

14. The process of claim 1 in which the resultant cuprous chloride-treated cadmium sulfide is maintained in an inert atmosphere at a temperature in the range of approximately 100–300° C. for 1–15 minutes.

References Cited

UNITED STATES PATENTS

| | | | |
|---|---|---|---|
| 2,820,841 | 1/1958 | Carlson et al. | 136—89 |
| 3,095,324 | 6/1963 | Cusano et al. | |
| 3,238,150 | 3/1966 | Behringer et al. | 117—201 X |
| 3,290,175 | 12/1966 | Cusano et al. | 136—895 |
| 3,374,108 | 3/1968 | Keramidas | 117—200 |

ALLEN B. CURTIS, *Primary Examiner.*

U.S. Cl. X.R.

136—89